(12) United States Patent
Shino et al.

(10) Patent No.: US 7,059,707 B2
(45) Date of Patent: Jun. 13, 2006

(54) INK JET PRINT HEAD

(75) Inventors: Naotoshi Shino, Chiba (JP); Yutaka Wakabayashi, Chiba (JP); Kazuyoshi Tominaga, Chiba (JP)

(73) Assignee: SII Printek Inc., Chiba (JP)

( * ) Notice: Subject to any disclaimer, the term of this patent is extended or adjusted under 35 U.S.C. 154(b) by 133 days.

(21) Appl. No.: 10/383,122

(22) Filed: Mar. 6, 2003

(65) Prior Publication Data

US 2003/0189619 A1    Oct. 9, 2003

(30) Foreign Application Priority Data

Apr. 3, 2002 (JP) .............................. 2002-101232
Jan. 23, 2003 (JP) .............................. 2003-015041

(51) Int. Cl.
*B41J 2/14* (2006.01)
*B41J 2/16* (2006.01)
*B41J 2/045* (2006.01)

(52) U.S. Cl. .......................................... 347/50; 347/68
(58) Field of Classification Search ................. 347/50, 347/68–72
See application file for complete search history.

(56) References Cited

U.S. PATENT DOCUMENTS 5,450,110 A     9/1995  Sato et al. ..................... 347/67
6,335,750 B1 *  1/2002  Horiuchi et al. ............. 347/200

FOREIGN PATENT DOCUMENTS

JP     2904629    3/1999
JP     3117340    10/2000

* cited by examiner

*Primary Examiner*—Stephen Meier
*Assistant Examiner*—Julian D. Huffman
(74) *Attorney, Agent, or Firm*—Adams & Wilks

(57) ABSTRACT

To prevent corrosion and disconnection of an anisotropic conductor film due to ink and ink vapor and to eliminate discharge defects in an ink jet print head having a structure in which a head chip and a circuit substrate for driving the head chip are interconnected by an FPC substrate through the anisotropic conductor film, an outer periphery of the interconnecting portion is molded throughout a full range by a sealant so as to cut off the interconnecting portion from external air. The sealant is of an epoxy type, a silicone type or an acrylic type. An epoxy sealant having low viscosity (50 pa·s or below) and high hardness (85 or more: JISA standard) is used for a first layer sealant of the interconnecting portion and a silicone sealant having high viscosity (70 pa·s or more) is used for a second layer sealant to achieve a two-layered molding structure.

9 Claims, 3 Drawing Sheets

INK JET PRINT HEAD

BACKGROUND OF THE INVENTION

1. Field of the Invention

This invention relates to an ink jet print head having a construction in which a head chip and a circuit substrate are interconnected by a flexible print substrate through an anisotropic conductor film, for use in a recording unit and in an ink jet type recording apparatus, for example. More particularly, the invention relates to a molding structure of an interconnecting portion that prevents corrosion and disconnection of an anisotropic conductor film (hereinafter called ACF) at the interconnecting portion resulting from exposure of the AFC to ink and ink vapor during a continuous printing operation, at the time of a maintenance of a recording apparatus, during production of a head and during storage under a packaged state for a long time, and that eliminates discharge defects.

2. Description of the Related Art

Various ink jet printer heads having a construction in which a head chip and a circuit substrate are interconnceted by a flexible print subtrate (hereinafter called "FPC subtrate") through an anisotropic conductor file have been marketed in recent years.

FIG. 3 shows a construction of a heretofore known ink jet print head. As shown in FIG. 3, the ink jet print head includes as its main components a nozzle plate 40, a nozzle support plate 30, a head chip 50, an aluminum base 20, a flow passage substrate 60, a circuit substrate 10 for supplying electrical signals to drive the head chip 50 and an FPC substrate for interconnecting the circuit substrate to the head chip, not shown in FIG. 3.

Ink droplets jetted from the head chip shoot onto a print paper or print medium through fine apertures formed on the nozzle plate. The fine ink droplets that fail to shoot but change to mist tend to float and adhere to the nozzle plate surface and to the head outer peripheral portion. Dust in the air and the ink droplets remaining at the time of ink suction also adhere to the nozzle plate suface. Therefore, when continuous printing is make, the operation must be conducted while the nozzle surface is preiodcally wiped by use of a wiper blade to remove a large number of fine floating ink droplets, dusts and residual ink droplets adhering to the nozzle plate surface. Continuous printing in a normal printing operation is achieved while such maintenance is conducted.

The known ink jet print head has a construction shown in FIG. 2. This drawing is a sectional view of the known ink jet print head taken along a line A–A' of the ink jet head shown in FIG. 3. The drawing shows the section of a structural portion for interconnecting the head chip 50 including the circuit substrate 10 and the piezoelectric ceramic plate by the FPC substrate 70 through the ACF 80.

As shown in the drawing, the ACF 80 is molded with an adhesive 110 lest it comes into direct contact with external air. This structure is a single-layered molding structure sealed by a sealant such as an epoxy adhesive, a silicone adhesive or an acrylic adhesive. A sealant having low permeability of air and vapor is used for the sealant, and protects the interconnecting portion from changes of temperature and humidity. When oil ink, water base ink, solvent ink or UV-curing ink is used as ink, however, it becomes difficult to secure sufficient sealing performance and corrosion resistance, and such functions have been required and proposed (refer, for example, to Japanese Patent No. 2,904, 629 (p 9 –11, FIG. 1)).

A two-layered molding structure has also been proposed as a method of improving sealing performance of a seal portion that interconnects the head chip 50 to the flow passage substrate 60, though this seal portion is different from the seal portion of the invention (refer, for example, to Japanese Patent No. 3,117,340).

When continuous printing is conducted for a long time at a high printing ratio that consumes large amounts of oil ink, water base ink, solvent or UV-curing ink within a short preiod, a problem develops in that residual ink that cannot be removed sufficiently by the wiping operation described above invades gaps among head constituent components. This problem results for capillary acting on the gaps between the constituent compoents and on the gaps with a casing for fitting the head. Due to capillary action, ink finally reaches the bonding portion of the FPC substrate of the head, corrodes and disconnects the ACF and invites discharge defects. Moisture-proofing means alone is not sufficient.

When ink is accidentally dropped and is caused to adhere to the bonding portion of the FPC substrate during production of the head or during maintenance of the recording apparatus having the head fitted thereto, the problem described above similarly occurs if ink is left standing as such for a long time.

Since the head is put into a plastic bag and is preserved under the sealed state at the time of packaging and shipment while a certain amount of ink remains, it is allowed to stand for a long time under an atomosphere of an extremely high ink concentration. Therefore, ink vapor enters the bonding portion of the FPC substrate of the head, corrodes and disconnects the ACF and invites the discharge defect.

In view of the problems described above, the invention aims at providing an ink jet print head that prevents corrosion and disconnection of the AFC by ink, ink vapor and moisture in air, and eliminates the discharge defect by molding the bonding portion of the FPC substrate of the ink jet head as a whole by use of a sealant.

SUMMARY OF THE INVENTION

In an ink jet print head having a construction in while a head chip is interconnected to a circuit substrate by an FPC substrate through an ACF, the invention molds an entire range of an outer preiphery of the interconnecting portion can be cut off from external air, i.e., the sealant is molded over the entire outer preiphery of the interconnecting portion.

The invention uses an epoxy adhesive, a silicone adhesive or an acrylic adhesive for the sealant. The invention uses an epoxy sealant having low viscosity (50 pa·s or below) and high hardness (85 or more: JISA standard) for a first layer sealant of the interconnecting portion and a silicone adhesive having high viscosity (70 pa·s or more) for a second layer sealant thereof, and accomplishes a two-layered molding structure.

The construction described above provides an ink jet print head that can prevent corrosion and disconnection of the ACF of the interconnecting portion due to accidental sag of ink during a continuous printing operation and production of the head and at the time of maintenance of the recording apparatus, and due to exposure of the ACF to ink, ink vapor and moisture in air during storage under a packaged state for a long time, and can eliminate the discharge defect.

DESCRIPTION OF THE PREFERRED EMBODIMENT

A preferred embodiment of the invention will be explained hereinafter with reference to the accompanying drawings.

Figure 1:
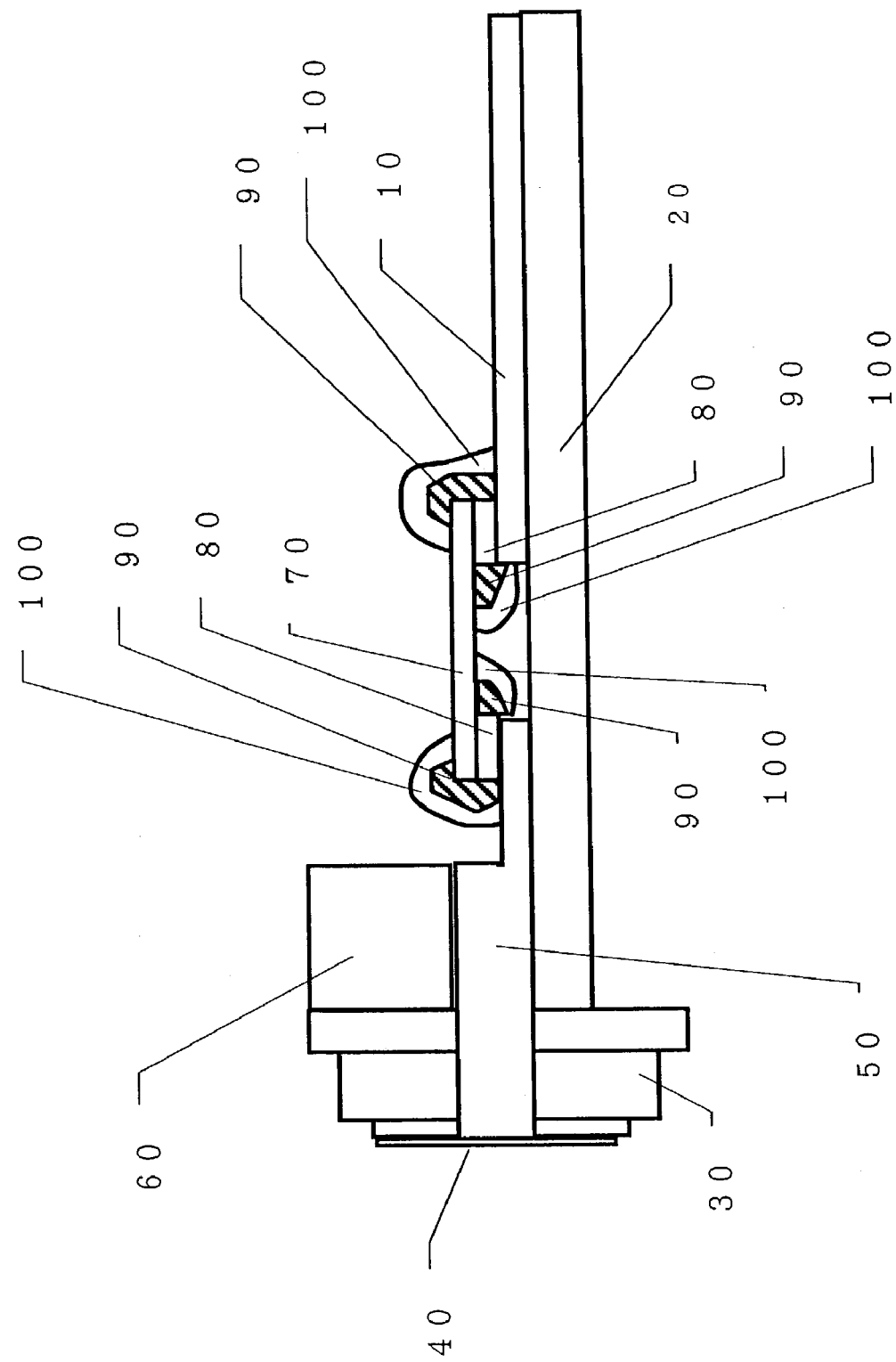
FIG. 1 is a sectional view of a print head according to the invention.
Figure 2:
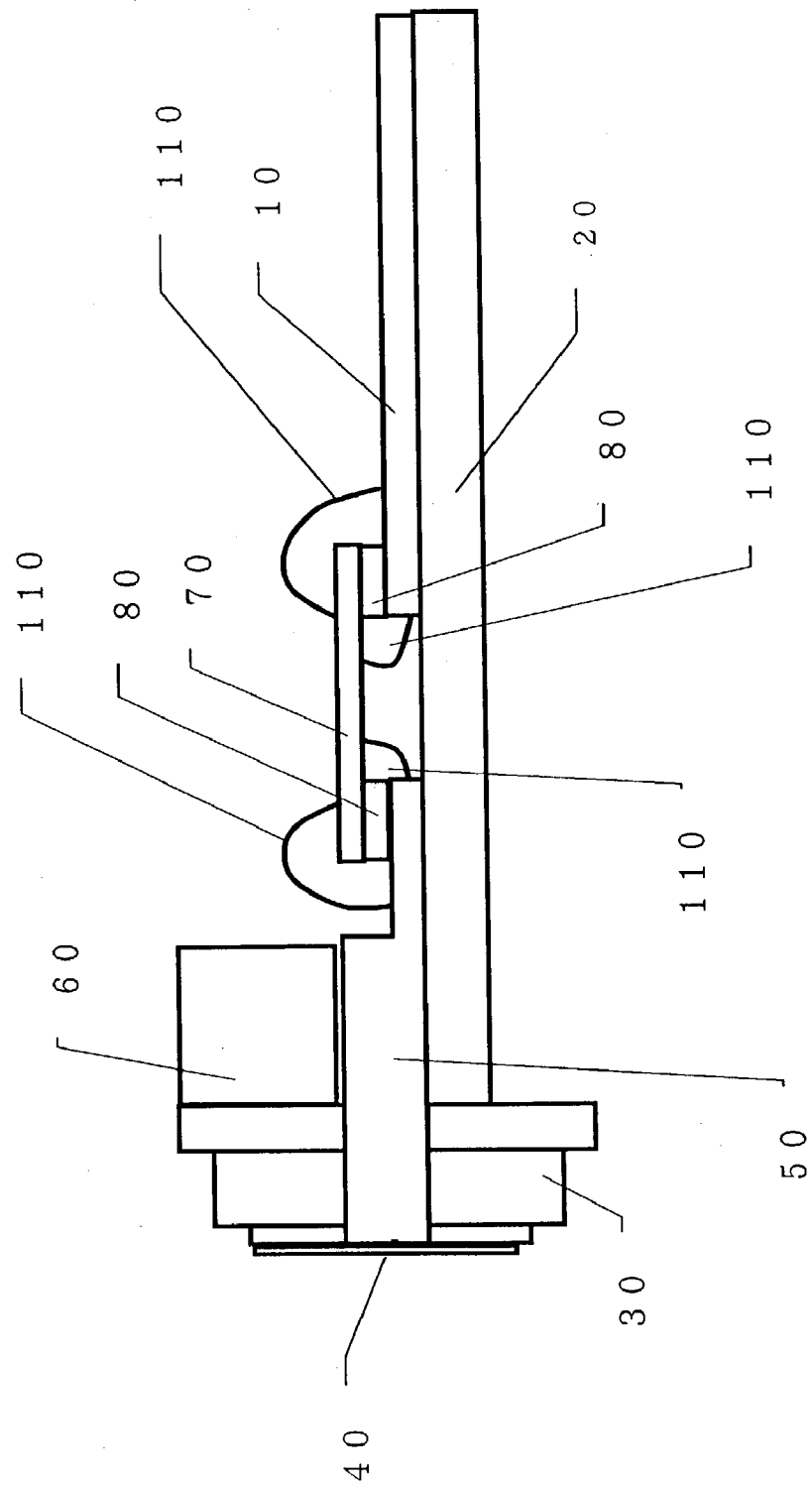
FIG. 2 is a sectional view of a print head according to a prior art technology.
Figure 3:
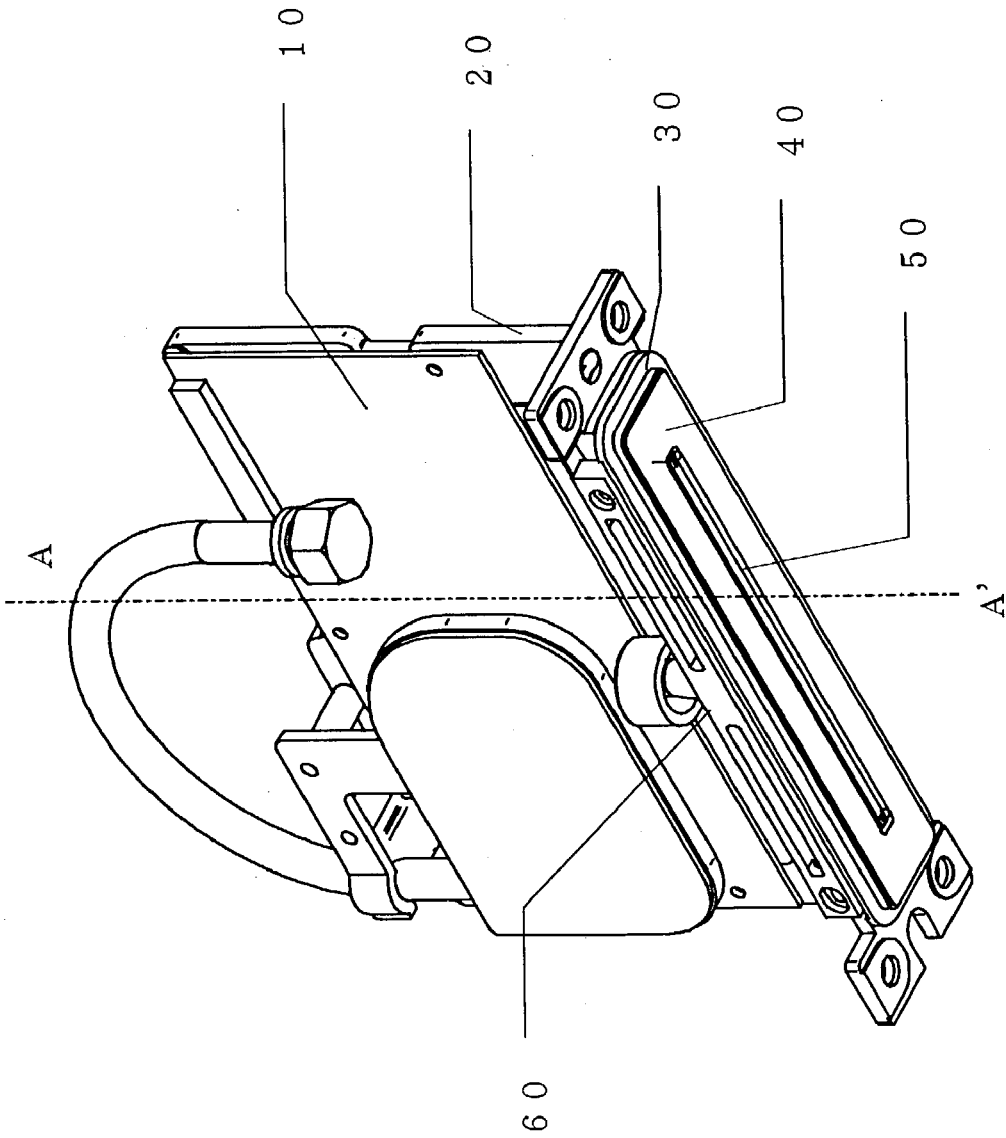
FIG. 3 is a perspective view of the print head according to the prior art technology.

FIG. 1 is a sectional view of an jet head according to the invention that is cut at a similar portion A–A' of the ink jet head shown in FIG. 3. In other words, the drawing is a sectional view of a structural portion that connects a circuit substrate 10 and a head chip 50 by an FPC substrate 70 through an ACF 80. As shown, one end portion of the FPC 70 is connected through an ACF 80 to the head chip 50 and the other end portion of the FPC 70 is connected through an AFC 80 to the circuit substrate 10.

The AFC 80 is molded with an adhesive lest it comes into direct contact with external air as shown in the drawing. This structure has a two-layered molding (sealant) structure of two kinds of adhesive, that is, an epoxy adhesive 90 and a silicone adhesive 100, that are molded. As shown in FIG. 1, two-layered molding or sealant structures are provided at each of the two end portions of the FPC 70. Each molding or sealant layer has a thickness of about 2 mm, or the structure has a total thickness of about 4 mm. The greater the thickness of the molding, the higher becomes the sealing effect. However, the thickness is preferably from hundreds of microns (μm) to several millimerters (mm) from the aspects of cost and working factor.

The thickness of the adhesive and the number of the molding layers are determined by conducting experiments in consideration of required durability that varies with an environment of use. The epoxy adhesive as the first layer sealant in the invention has low viscosity (5 pa·s) but has high hardness (88: JISA standard). On the other hand, the silicone adhesive as the second layer sealant has high viscosity (70 pa·s). As to viscosity, the epoxy adhesive 90 of the first layer having low viscosity enters small gaps between the ACF 80 and the FPC 70 and improves sealing performance. On the other hand, the silicone adhesive having high viscosity can easily stay with a certain thickness on the planar surface of the FPC substrate and improves sealing performance at such a planar portion. The viscosity of each adhesive is not particularly limited to the value described above. Since the size of the gap of the ACF interconnecting portion and planarity of the FPC affect the viscosity, the viscosity is determined through experiments.

As to hardness, the epoxy adhesive as the first layer sealant has high hardness (85 or more: JISA standard) and provides the sealing effect for oil ink, solvent ink and UV-curing ink (from results of reliability experiments for ink). On the other hand, the silicone adhesive as the second layer sealant provides the sealing effect for water base ink and moisture in air. Such properties are generally known.

A construction that fits a cover for covering the entire exposed portion of the FPC substrate may be conceivable as a construction for preventing the ink from coming into direct contact with the ACF portion 80. In this case, too, gaps exist between the cover and the head, around the outer periphery of a connector portion for an external interface, and so forth. Therefore, the ACF portion cannot be completely cut off from external air.

For this reason, the cover construction cannot provide the high sealing effect, and the molding construction of the invention is more effective. The additional effects are explained below.

When the ACF interconnecting portion is sealed by use of the two kinds of sealants, that is, the epoxy adhesive 90 and the silicone adhesive 100, these sealants are applied in such a fashion as not to be applied to an aluminum base portion 20 as shown in FIG. 1. When this arrangement is employed, it is possible to prevent the sealant having a lower coefficient of linear expansion from being destroyed by the aluminum base having a higher coefficient of linear expansion when heat is applied to the print head during the production process and during the environmental operation.

In the ink jet print head produced with such a construction, it is possible to prevent corrosion and disconnection of the ACF interconnecting portion that occur when the ACF interconnecting portion is exposed to ink, ink vapor and moisture in air due to accidental sag of ink during the continuous printing operation, during production of the head, at the time of maintenance of a recording apparatus and during storage under a packaged state for a long time. Furthermore, it is possible to eliminate discharge defect.

When the ink jet print head having the construction described above is used, reliability can be improved as tabulated in Table 1. Table 1 tabulates a reliability test result (at normal temperature) conducted by use of ink for ink jet. Similar results are obtained when oil ink, water base ink, solvent ink and UV-curing ink are used as ink.

Table 2 tabulates evaluation results of a spreading state of the adhesive at the molding portion when the viscosity of the adhesive is changed. It can be appreciated from the results that sealing performance of only a slight gap (spreading of adhesive) cannot be secured in the case of the single-layered molding unless the adhesive has a viscosity of 50 pa·s or below. Therefore, the threshold value of the low viscosity adhesive providing high sealing performance is preferably 50 pa·s or below. Table 3 tabulates evaluation results of high viscosity adhesives having a high staying property at the flat portion.

An ink immersion test is conducted by applying a low viscosity adhesive (5 pa·s) to the first layer and then an adhesive having a different viscosity onto the first layer adhesive. A high viscosity adhesive (70 pa·s) can easily form a coating thickness of 500 μm and the test result is excellent. Other adhesives having low viscosity cannot easily increase the coating thickness, and the result is not good. This result represents that the viscosity of the sealant is preferably at least 70 pa·s to keep excellent immersibility of ink at the molding portion.

Table 4 represents the evaluation result of correlation of hardness of the epoxy adhesive with sealing performance (ink immersion resistance) of oil ink, solvent ink and UV-curing ink. It can be appreciated from this result that hardness of the epoxy sealant is preferably at least 85 (JISA standard) in order to keep high sealing performance of the epoxy sealant.

TABLE 1

| Adhesive | No. of molding layers | Ink immersion test result of molding portion (No. of days of durability) | Leaving test result of package in ink vapor (No. of days of durability) |
|---|---|---|---|
| Without molding | 0 | 4 days | 3 weeks |
| Silicone type | 1 | 2 weeks | 2 months or more |
| Epoxy type | 1 | 2 weeks | 2 months or more |
| Silicone + epoxy types | 2 | 1 month | 2 months or more |

TABLE 2

| Viscosity of adhesive (epoxy type) (epoxy type is typical example) | Coating thickness of adhesive (single layer structure) | Spreading test result of sealant at molding portion (good/defective) |
|---|---|---|
| 5 pa · s | 200 μm | Good |
| 50 pa · s | 200 μm | Good |
| 70 pa · s | 200 μm | Defective |

TABLE 3

| Viscosity and coating thickness of first layer adhesive | Viscosity of second layer adhesive | Coating thickness of adhesive formable at second layer | Oil ink immersion test result of molding portion (oil ink is typical example) |
|---|---|---|---|
| 5 pa · s, 200 μm | 5 pa · s | 200 μm | Defective |
| 5 pa · s, 200 μm | 50 pa · s | 300 μm | Defective |
| 5 pa · s, 200 μm | 70 pa · s | 500 μm | Good |

TABLE 4

| Hardness of epoxy adhesive (JISA standard) | Coating thickness of adhesive (single-layered structure) | Ink (oil, solvent, UV-curable) immersion test result of molding portion (good/defective) |
|---|---|---|
| 85 | 500 μm | Good |
| 70 | 500 μm | Defective |
| 60 | 500 μm | Defective |

This embodiment uses an adhesive of Able Stick Co. 931-1T1N1 for the epoxy adhesive and an adhesive of Three-Bond Co. 1211 for the silicone adhesive. However, the adhesives are not limited to these adhesives so long as the viscosity and sealing performance satisfy the functions described above. Concrete examples of other adhesives include Able Stick 868-7UNF, 342-13ACC and 342-37 for the epoxy adhesive and Toray-Dow Corning Co. 4486 for the silicone adhesive.

Though the embodiment represents the two-layered molding structure, the invention includes a single-layered molding structure of the silicone adhesive and a single-layered structure of the epoxy adhesive.

The ink used in the invention is the ink for ink jet, and includes all of oil ink, water base ink, solvent ink and UV-curing ink.

As explained above, in the ink jet head according to the invention, the FPC substrate adhesive portion is molded as a whole by use of then sealants. Therefore, the invention can prevent corrosion and disconnection of the ACF due to ink, ink vapor and moisture in the air, can eliminate discharge defects and can prevent a reduction in production yield.

The invention claimed is:

1. An ink jet print head comprising:
    a head chip for jetting ink-jet ink stored in a groove formed in a piezoelectric ceramic plate from a nozzle aperture by changing a capacity of the groove;
    a nozzle plate bonded to an end face of the head chip at which the groove opens, the nozzle plate having the nozzle aperture formed therein;
    a nozzle support plate arranged around an outer periphery of the head chip on the side of the nozzle plate;
    a flow passage substrate for supplying ink to the groove, the flow passage substrate being bonded to the head chip on the side of the end face at which the groove opens;
    an interconnecting portion interconnecting the head chip and a circuit substrate for driving the head chip by a flexible print substrate through an anisotropic conductor film; and
    a sealant molded over the entire outer periphery of the interconnecting portion and having a two-layered molding structure comprised of a first layer contacting the outer periphery of the interconnecting portion and comprising a low viscosity sealant (50 pa·s or below) and a second layer covering the first layer and comprising a high viscosity sealant (70 ps·a or more).

2. An ink jet print head according to claim 1; wherein the first layer is an epoxy sealant and the second layer is a silicone sealant.

3. An ink jet print head according to claim 1; wherein the first layer comprises an epoxy sealant having high hardness (85 or more: JISA standard) and the second layer comprises a silicone sealant.

4. In an ink jet print head having a head chip for controlling the jetting of ink onto a print medium and a circuit substrate for supplying electrical signals to drive the head chip: a flexible print substrate having two spaced-apart end portions, one of the two end portions being connected through a conductor film to the head chip and the other of the two end portions being connected through a conductor film to the circuit substrate; and a pair of two-layered sealant structures formed over exposed outer peripheries of respective ones of the conductor films to protect the conductor films, each two-layered sealant structure comprising a first sealant layer of low viscosity completely covering the exposed outer periphery of the conductor film, and a second sealant layer of high viscosity completely covering the first sealant layer.

5. An ink jet print head according to claim 4; wherein the first sealant layer of each two-layered sealant structure has a viscosity of 50 pa·s or below.

6. An ink jet print head according to claim 5; wherein the second sealant layer of each two-layered sealant structure has a viscosity of 70 pa·s or more.

7. An ink jet print head according to claim 4; wherein the second sealant layer of each two-layered sealant structure has a viscosity of 70 pa·s or more.

8. An ink jet print head according to claim 4; wherein the first layer of each two-layered sealant structure has a hardness of 85 or more based on the JISA standard.

9. An ink jet print head according to claim 4; wherein the first sealant layer of each two-layered sealant structure comprises an epoxy sealant and the the second sealant layer of each two-layered sealant structure comprises a silicone sealant.

* * * * *